United States Patent [19]
Tanahashi et al.

[11] Patent Number: 5,474,834
[45] Date of Patent: Dec. 12, 1995

[54] SUPERCONDUCTING CIRCUIT SUB-ASSEMBLY HAVING AN OXYGEN SHIELDING BARRIER LAYER

[75] Inventors: Shigeo Tanahashi; Takanori Kubo; Kazuhiro Kawabata, all of Kagoshima, Japan

[73] Assignee: Kyocera Corporation, Kyoto, Japan

[21] Appl. No.: 257,486

[22] Filed: Jun. 9, 1994

Related U.S. Application Data

[63] Continuation of Ser. No. 27,867, Mar. 8, 1993, abandoned.

[30] Foreign Application Priority Data

| Mar. 9, 1992 | [JP] | Japan | 4-050825 |
| Apr. 20, 1992 | [JP] | Japan | 4-099245 |
| Apr. 20, 1992 | [JP] | Japan | 4-099246 |
| Apr. 21, 1992 | [JP] | Japan | 4-100863 |
| Apr. 27, 1992 | [JP] | Japan | 4-107108 |

[51] Int. Cl.[6] ............................. B32B 9/00
[52] U.S. Cl. ............... 428/209; 428/930; 428/901; 428/688; 428/210; 505/812; 505/813; 361/748; 361/750; 361/751
[58] Field of Search ................. 428/209, 901, 428/688, 689, 210, 930, 620; 505/812, 813, 814, 817, 818, 820, 822, 815, 874; 257/31; 361/748, 749, 750, 751, 688

[56] References Cited

U.S. PATENT DOCUMENTS

| 3,852,877 | 12/1974 | Ahn et al. | |
| 3,876,473 | 4/1975 | McDougall | 505/815 |
| 4,001,481 | 1/1977 | Tarutani | 428/469 |
| 4,316,200 | 2/1982 | Ames | 505/874 |
| 4,463,059 | 7/1984 | Bhattacharya | 428/620 |
| 4,504,552 | 5/1985 | Kim | 505/813 |
| 4,660,061 | 4/1987 | Sweeny et al. | 257/5 |
| 4,954,480 | 9/1990 | Imanaka | 505/1 |
| 4,963,701 | 10/1990 | Yasumoto et al. | 174/256 |
| 4,980,754 | 12/1990 | Kotani | 361/688 |
| 5,130,498 | 7/1992 | Yoshida et al. | 174/252 |

OTHER PUBLICATIONS

Tipler, Physics, 2nd Ed. Worth Publishers, Inc. p. 802.
Holmes, Handbook of Thick Film Technology Electrochemical Publ. Lim., 1976, pp. 74–75.
Tummala et al., "Microelectronics Packaging Handbook" Ch. 6, 1988, pp. 368–373.

Primary Examiner—Patrick J. Ryan
Assistant Examiner—Patrick Jewik
Attorney, Agent, or Firm—Spensley Horn Jubas & Lubitz

[57] ABSTRACT

A circuit sub-assembly as a mounting for an electronic component such as Josephson device, i.e., a superconducting element, comprises a ceramic insulating substrate, an oxygen-shielding barrier layer formed on the insulating substrate, and a circuit film of niobium, as a superconducting material formed on the barrier layer according to a desired pattern. The barrier layer prevents oxidation of the circuit layer by shielding it from oxygen present in the insulating substrate. Due to the barrier layer, the circuit film is scarcely subject to superconductivity-impairing oxidation. The circuit film is thus capable of high-speed electronic signal conduction.

14 Claims, 5 Drawing Sheets

SUPERCONDUCTING CIRCUIT SUB-ASSEMBLY HAVING AN OXYGEN SHIELDING BARRIER LAYER

This is a continuation of application Ser. No. 08/027,867 filed on Mar. 8, 1993, now abandoned.

BACKGROUND OF THE INVENTION

This invention relates to a circuit sub-assembly, more particularly, to a circuit sub-assembly serving as a mounting for a superconducting electronic component.

Circuit sub-assemblies in particular applications are constructed as enclosures for packaging electronic components. Therein, a circuit sub-assembly will principally comprise an insulating substrate on which a circuit layer is formed, usually by a thick-film forming method such as the molybdenum-manganese (Mo-Mn) method.

The Mo-Mn method involves the preparation of a paste by mixing powders of such high melting-point metals as wolfram, molybdenum and manganese, with an organic binder and solvent. The paste is then screen-printed, or otherwise applied by a similar means, onto a green sheet for forming the insulating substrate. Next, the paste-printed green sheet is baked under a reducing atmosphere, and thereby a circuit sub-assembly is obtained, incorporating the insulating substrate and the circuit layer in one.

The insulating substrate composing the foregoing circuit sub-assembly is generally made from such oxidized ceramics as a sintered product of aluminum oxide or mullite, or a sintered product of non-oxidized ceramics such as aluminum nitride or silicon carbide, superficially covered by an oxide film.

The foregoing circuit sub-assembly is not suitable for the high-speed conduction of electronic signals, due to the high electrical resistivity of the material of which the circuit layer is composed. In particular, were the sub-assembly to thus be employed as a mounting for a superconducting component such as Josephson device, the realization of the innate function of the superconducting component, i.e., its high-speed driving function, would not be practicable.

Consequently, the use of niobium, which is a superconducting material, for the circuit layer is now under investigation. A circuit sub-assembly having a circuit layer composed of niobium is capable of conducting an electronic signal rapidly; and in such an application accordingly the high-speed function of a superconducting component is realized. The niobium film composing the circuit can be formed onto an insulating substrate by the thin-film method.

During the process of forming the circuit layer onto the insulating substrate, however, since niobium is easily oxidized, it tends to react with oxygen contained in the insulating substrate. The resulting oxides deprive the niobium of its superconductivity, again making impracticable the high-speed conduction of electronic signals, even wherein the circuit layer of the circuit sub-assembly is composed of niobium.

SUMMARY OF THE INVENTION

An object of the present Invention is to realize high-speed conduction of electronic signals in a circuit packaging a superconducting electronic component.

According to one aspect of the present invention, a circuit sub-assembly serving as a mounting for electronic components comprises a ceramic insulating substrate, a barrier coating formed on the insulating substrate, and a circuit film formed on the barrier coating. The barrier layer is oxygen shielding, and the circuit film is formed of niobium as a superconducting material.

An electronic component is mounted onto the circuit sub-assembly on a designated position of the circuit layer by, for example, soldering. The circuit film as composed of niobium is scarcely oxidized by oxygen contained in the insulating substrate, since the circuit film is not formed directly on the insulating substrate, but on the barrier coating. Consequently, reduction In the superconductivity of the circuit film is minimized such that the circuit film is therefore effective for the high-speed conduction of electronic signals.

One embodiment of the foregoing circuit sub-assembly further comprises a metallic bonding film formed on the circuit film, and a covering film formed on the bonding film. The bonding film is formed, specifically, of copper, gold, silver, platinum, lead or tin. The covering film is formed on the bonding film exclusive of a position into which the electronic component is mounted, and can consist of niobium, molybdenum, titanium, tantalum, wolfram, aluminum or rhenium.

Both the metallic layer and the covering layer of this circuit sub-assembly are thus composed of non-magnetic material. Accordingly, there is scarce tendency for electronic signals passing through the circuit film to remain behind in magnetic fields therein; viz., the electronic signals are scarcely affected by noise. Moreover, the electronic component can be directly soldered onto the metallic layer having good solder wettability, through which the component is accordingly stably fixed to the circuit film.

Another embodiment of the foregoing circuit sub-assembly further comprises a first metallic layer formed on the circuit layer, and a second metallic layer formed on the first metallic layer. The first metallic layer is formed at a position for mounting an electronic element, and is composed of non-magnetic material. The second metallic layer can consist either tin and or a tin-lead alloy.

Electronic signals passing through the circuit film of this circuit sub-assembly scarcely generate magnetic fields therein as well, due to the non-magnetic composition of the first metallic layer, therefore the electronic signal is scarcely subject to noise interference. Moreover, the electronic element can be stably mounted onto the second metallic layer, it being composed of a metallic material of high solder wettability.

A further embodiment of the foregoing circuit sub-assembly comprises an insulating layer formed on the circuit film, and a superficial circuit film formed on the insulating layer. The insulating layer includes an internal circuit in connection with the circuit film, and the superficial circuit film is connected with the internal circuit. Both the internal circuit and the superficial-circuit film are formed of niobium.

Onto the circuit sub-assembly, an electronic component is fixed, in an accordingly designated position of the superficial circuit film.

The circuit sub-assembly of the foregoing embodiments can, according to another aspect of the present invention, be composed of an electrically insulating material, containing oxygen of 5.0 weight percent or less. The circuit film of the circuit sub-assembly is likewise formed of niobium.

The niobium, comprising the circuit film In this circuit sub-assembly is scarcely subject to oxidation, since the amount of oxygen in the substrate is restricted. Consequently, the superconductivity of the circuit layer is scarcely impaired, and accordingly the circuit film effects high-speed conduction of electronic signals.

The foregoing and other objects and advantages of the present invention will be more fully apparent from the following detailed description.

DESCRIPTION OF THE PREFERRED EMBODIMENTS

Figure 1:
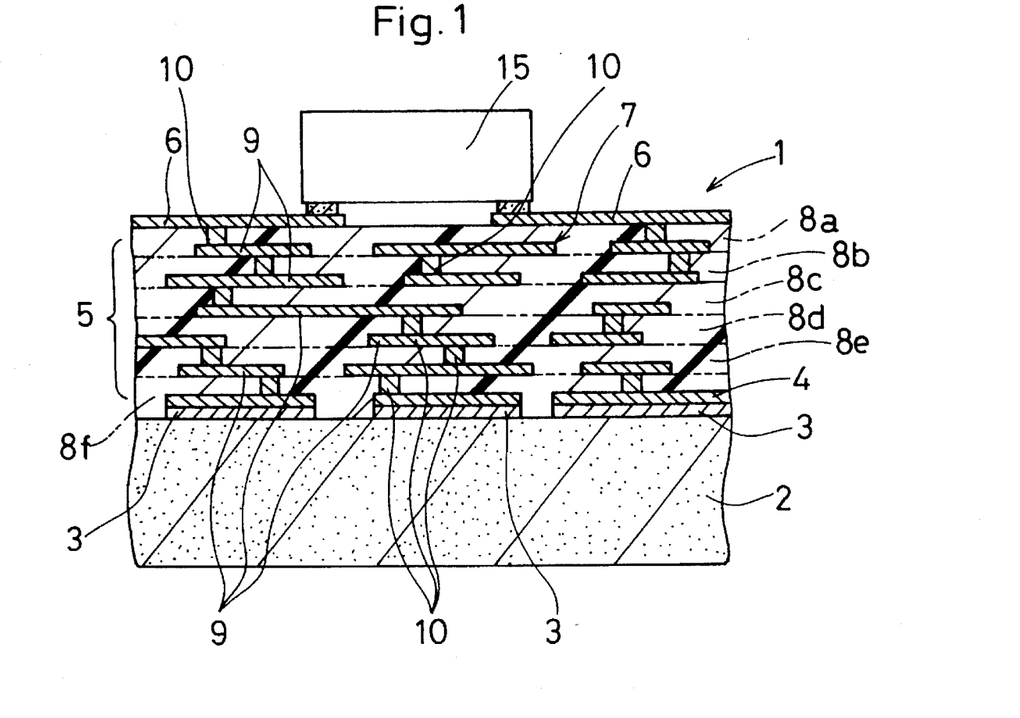
FIG. 1 is a schematic cross-sectional view of a preferred embodiment of the invention.

A circuit sub-assembly 1 according to one embodiment of the invention principally comprises, as illustrated in FIG. 1, an insulating substrate 2, a barrier layer 3 formed on the insulating substrate 2, a circuit film 4 formed on the barrier layer 3, an insulator 5 formed on the circuit film 4, and a superficial circuit laminate 6 formed on the insulator 5.

The insulating substrate 2 is a board, and is composed of a metallic oxide ceramic material such as a sintered product of aluminum oxide or mullite. The substrate 2 also can be composed of non-oxide ceramic, examples of which include a sintered product of aluminum nitride or silicon carbide. In these cases, however, the material exteriorly comprises an oxide film.

The barrier layer 3 serves to prevent direct contact between the circuit film 4 and tile insulating substrate 2, in order to prevent the circuit film 4 from being oxidized by oxygen from the insulating substrate 2. The barrier layer 3 can consist of titanium, molybdenum, wolfram, aluminum, tantalum, titanium-wolfram, tantalum nitride or insulating resin. Other than the insulating resin, these materials can be used singly or in combination.

If the barrier layer 3 is to be composed of any of the foregoing materials with the exception of the insulating resin, it is desirable that the coating thickness be within 0.1 to 1.0 μm. A thickness of less than 0.1 μm would not be effective for preventing the circuit film 4 from being oxidized by oxygen contained in the insulating substrate 2. Conversely, if the thickness were over 1.0 μm, stress arising in the forming procedure would strain the barrier layer 3, deteriorating bonding strength between it and the insulating substrate 2.

If the barrier layer 3 is to be composed of the insulating resin, it is desirable to use a polyimide resin as the insulating resin. In this case, it is preferable to establish the thickness of the barrier layer 3 to be within 3.0 to 30.0 μm. If the thickness is outside the limits of this range, problems as in the case in which the barrier layer 3 is composed of other materials in films of improper thickness would occur likewise.

The circuit film 4 conducts electronic signals, and is designed to have a desired circuit pattern. The circuit film 4 is formed from niobium, which is a superconducting material is desirable that the layer thickness of the circuit film 4 be within the range of 1.0 to 5.0 μm. If the thickness were less than 1.0 μm, the circuit film 4 may become spotty, marred by extremely thin patches, due to superficial roughness of the barrier layer 3, and accordingly normal electronic signal conduction would be Impaired. Conversely, if the thickness were over 5.0 μm, stress arising in the forming procedure would strain the circuit film 4 remains, deteriorating bonding strength between it and the barrier layer 3.

The insulator 5 is a bonded pack of tiered resin sheets 8a through 8f, and incorporates an internal circuit. Each resin sheet 8a–8f is composed of an electrically insulating resin, such as polyimide resin. The internal circuit 7 mainly comprises inner connections 9 arranged between each sheet 8a–8f, and feedthroughs 10 interconnecting the inner connections 9 with each other. Like the circuit film 4 both the inner connections 9 and the feedthroughs 10 are also composed of niobium. The internal circuit 7 is connected with the circuit film 4 via the feedthroughs 10 of the sheet 8f.

Figure 2:
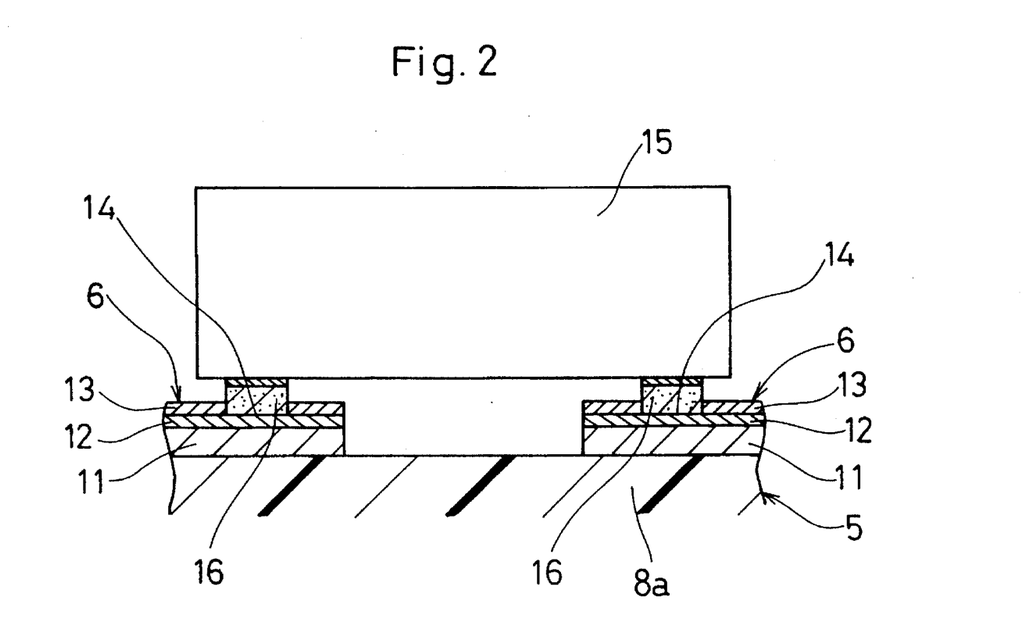
FIG. 2 is a partially enlarged view of FIG. 1.

The superficial circuit laminate 6 is designed to form a desired circuit pattern on tile insulator 5. Referring to FIG. 2, the superficial circuit laminate 6 is a triple-layered structure including base, intermediate and covering films 11,12, and 13 in that order from tile insulator 5. The base film 11 is formed of niobium. The intermediate film 12 is for enhancing the bonding strength between the base film 11 and an electronic component, and is composed of copper, gold, silver, platinum, lead or tin. These metallic materials may be used singly or in combination.

It is desirable that the thickness of the intermediate film 12 be within the range of 1.0 to 10.0 μm. If the thickness were less than 1.0 μm, the fixing strength between the electronic component and the superficial circuit laminate 6 would deteriorate, since the intermediate film 12 tends to diffuse during soldering to mount the electronic component, such that it comes into direct contact on the base film 11, having lesser solder wettability. Conversely, if the thickness were over 10.0 μm, stress arising during the procedure of forming intermediate film 12 strains the film, deteriorating the bonding strength between it and the base film 11. The covering film 13 is for preventing excessive spread of solder when mounting an electronic component on the superficial circuit laminate 6, and is formed on the intermediate film 12 exclusive of the position 14 in which an electronic element is fixed. The covering film 13 consists of a material having poor solder wettability. Examples of suitable materials include niobium, molybdenum, titanium, tantalum, wolfram, aluminum and rhenium. These materials can be used in combination. The thickness of the covering film 13 would in most cases be set to be within from 0.05 to 2.0 μm.

The superficial circuit laminate 6 is connected with the internal circuit via the feedthroughs of the sheet 8a.

Following is an example of a method of manufacturing the foregoing circuit sub-assembly 1.

The first step is to obtain an insulating substrate 2. To manufacture the insulating substrate 2, a slurry is initially prepared by mixing raw materials comprising alumina ($Al_2O_3$), silica ($SiO_2$), calcia (CaO) and magnesia (MgO) with an organic binder and a solvent; wherein for example the insulating substrate 2 is to consist of a sintered product of aluminum oxide. The slurry is then formed into a green sheet, employing a doctor blade or a calender roller. The green sheet is baked at a temperature of about 1600 ° C., whereby the insulating substrate 2 is obtained. The insulating substrate 2 also can be produced by baking a press-shaped mixture of the foregoing raw materials, an organic binder and a solvent.

In the next step, tile barrier layer 3 is formed onto the insulating substrate 2. The barrier layer 3 can be formed by a thin-film forming method, such as sputtering, deposition, or ion-plating, if the barrier layer 3 is to consist of a metallic material other than an insulating resin. If the barrier layer 3 is an insulating resin such as polyimide resin, it can be formed by heating, at about 400° C., a polymeric solution comprising 4,4'-diamionodiphenylether of 50 mol %, diaminodiphenylsulfon of 50 mol %, and 3,3',4,4'-diphenyltetracarbonic dianhydride, applied on the insulating substrate using a spin-coating method.

Next, the circuit film 4 is formed on the barrier layer 3. The circuit film 4 can be formed following a thin-film forming method. Specifically, the circuit film 4 can be formed following a forming process comprising the steps of: forming a thin niobium film on the barrier layer 3 by sputtering or ion-plating, and etching the film into a desired pattern following a photo-lithography method.

During the procedure of forming the circuit film 4, the film 4 is scarcely oxidized since the barrier layer 3 prevents oxygen contained in the insulating substrate 2 from contacting the circuit film 4, protecting the superconductivity of the circuit film 4 can be maintained against impairment due to oxidation.

In the next step, the insulator 5 is formed. The insulating layer 5 can be formed by tiering the sheets 8a–8f from the bottom up, meanwhile forming the internal circuit 7. The sheets 8a–8f and the Inner connections 9, respectively, can be formed likewise described for as the resinous barrier layer 3 and the circuit film 4. When forming the sheets 8a–8f, the feedthroughs 10 are formed at the same time.

Subsequently, the superficial circuit laminate 6 is formed on the insulator 5. When producing the superficial circuit laminate 6, the base film 11, the intermediate film 12 and the covering film 13 are formed, in that order, on the insulator 5. These layers 11, 12 and 13 can be formed in a manner similar to the formation of the circuit film 4.

As shown in FIGS. 1 and 2, an electronic component 15, in this case a Josephson device is mounted onto a corresponding position 14 of the circuit sub-assembly 1, and fixed with solder 16. The high solder wettability of the intermediate film 12 ensures adherence of the solder 16, such that the electronic component 15 is stably fixed on the superficial circuit laminate 6. Further-more, overflow of the solder 16 is checked by the covering film 13, and accordingly the solder 16 does not spread excessively onto the superficial circuit laminate 6.

An electronic signal in the circuit sub-assembly 1 on which the electronic component 15 is mounted runs in the circuit film 4, the internal circuit 7 and the superficial circuit laminate 6, and is conducted to the electronic component 15. Therein, the electronic signal travels at high speed, since the circuit film 4, the internal circuit 7 and the base film 11 of the superficial circuit laminate 6 all consist of niobium, i.e., a superconducting material having low electric resistivity. Since niobium is also a non-magnetic material, the electronic signal does not give rise to a residual magnetic fields in either the circuit film 4, the internal circuit 7 or the superficial circuit laminate 6. Therefore, there is scarcely any noise which would otherwise be generated by residual magnetic fields, impairing the electronic signal, such that the electronic signal is correctly conducted to the electronic component 15.

Since oxygen contained in the insulating substrate 2 is prevented from oxidizing the circuit film 4, due to the barrier layer 3, the superconducting characteristics of the circuit sub-assembly 1 scarcely diminish.

Figure 3:
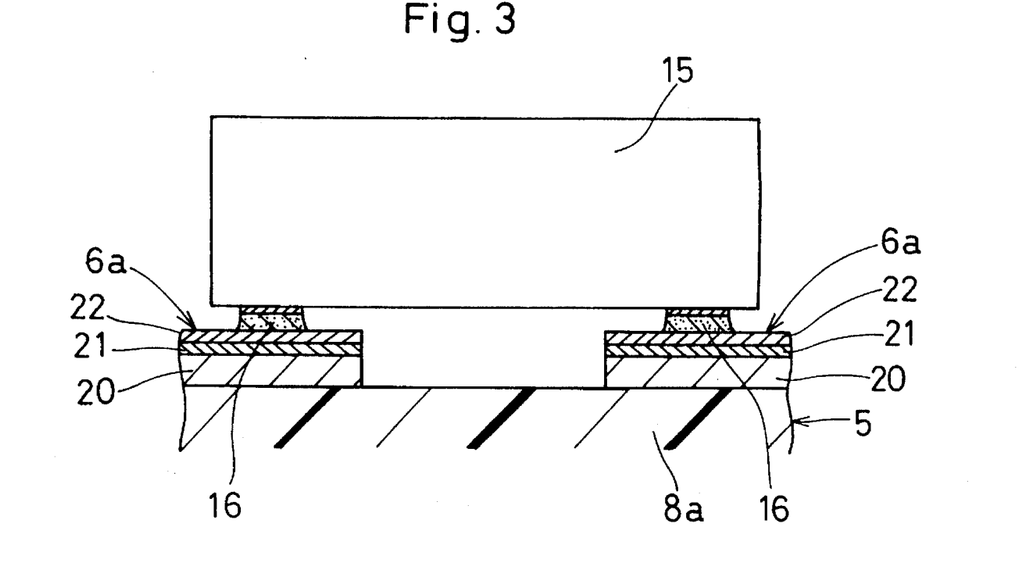
FIG. 3 is a view corresponding to FIG. 2 of a modification of the embodiment diagramed in FIG. 1.

In this embodiment, the superficial circuit laminate 6 can be replaced by a superficial circuit laminate 6a as shown in FIG. 3. Referring to FIG. 3, the superficial circuit laminate 6a is a triple-layer structure having base, intermediate and covering films 20, 21 and 22 in that order from the insulator 5. Like the base film 11 of the foregoing circuit sub-assembly 1, the base film 20 consists of niobium. The intermediate film 21 consists of a non-magnetic material such as copper, the thickness of which is established to be within 1.0 to 10.0 μm. The covering film 22 is composed of tin or tin-lead, of thickness within the range of 0.1 to 3.0 μm. If the thickness is less than 0.1 μm, the solder-wettability of the covering film 22 is reduced such that it becomes Impracticable to fix an electronic component stably. Conversely, wherein the thickness is greater than 3.0 μ m, solder for fixing the electronic component 15 tends to form globules reducing the effective a bonding area between the electronic component 15 and the covering layer 22, and accordingly impairing the bonding strength therebetween.

The electronic component 15 is fixed onto a desired position of the superficial circuit laminate 6a using solder 16. Therein, the electronic component 15 is directly soldered onto the covering film 22 of the superficial circuit laminate 6a. Both the base film 20 and the intermediate film 21 of the superficial circuit laminate 6a are composed of non-magnetic material, such that, like the superficial circuit laminate 6 of the foregoing circuit sub-assembly 1, the electronic signals are scarcely subject to noise.

Figure 4:
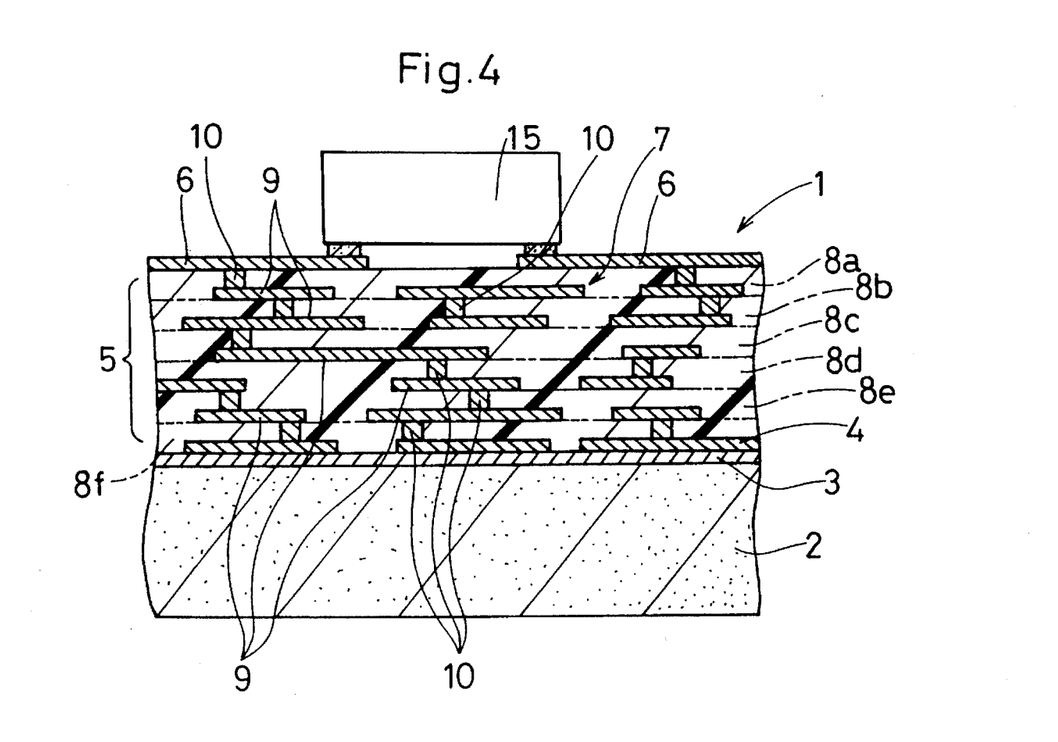
FIG. 4 is a view of another modification of the embodiment, corresponding to FIG. 1.

In the embodiment described in the foregoing, the barrier layer 3 is formed only between the circuit film 4 and the insulating substrate 2; however, the barrier layer 3 can be formed on all over the entire insulating substrate 2, as shown in FIG. 4, if the barrier layer 3 consists of the electrically insulating resin.

Other Embodiments (a) In the foregoing, the present invention is embodied to include the insulator 5 incorporating the internal circuit 7, formed on the barrier layer 3; however the invention can be embodied without the insulator 5.

Figure 5:
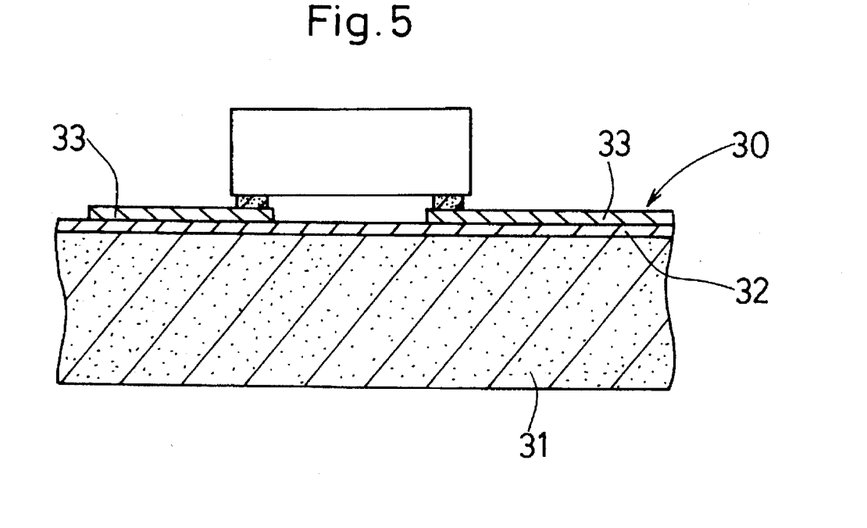
FIG. 5 is a schematic cross-sectional view of a second embodiment.

A circuit sub-assembly 30 composed without the insulator 5 is illustrated in FIG. 5. Referring to FIG. 5, the circuit sub-assembly 30 is shown to comprise chiefly an insulating substrate 31, a barrier layer 32 formed on the insulating substrate 31, and a circuit laminate 33 formed on the barrier layer 32 and designed according to a desired circuit pattern. The insulating layer 31 and the barrier layer 32 are formed likewise as the insulating substrate 2 and the barrier layer 3, respectively, of the foregoing embodiment are formed.

Figure 6:
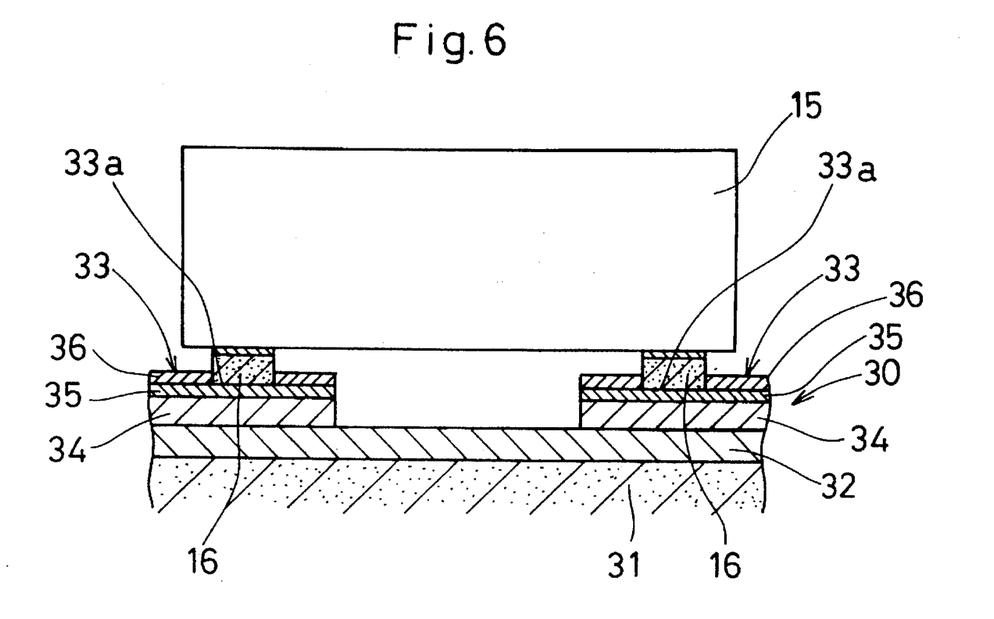
FIG. 6 is a partially enlarged view of FIG. 5.

As shown in FIG. 6, the circuit laminate 33 is a triple-layer structure having base, intermediate and covering films 34, 35, and 36, respectively, formed in a like manner as are the corresponding base, intermediate and covering films 11, 12, and 13 of the foregoing embodiment.

The electronic component 15 in this embodiment is fixed onto a fixing position 33a of the circuit laminate 38 with solder 16.

Figure 7:
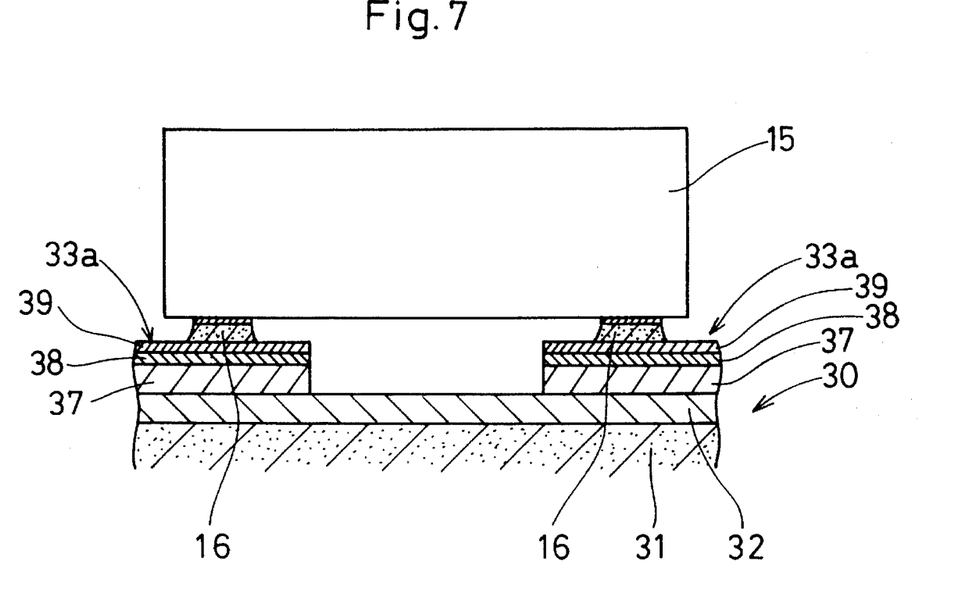
FIG. 7 is a view corresponding to FIG. 6 of a modification of the second embodiment.

Further, the circuit laminate 83 can be replaced by a superficial circuit laminate 33a, shown in FIG. 7, which is also a triple-layer structure, in this case having respective base, intermediate and covering films 37, 38, and 39. These films 37, 38 and 39 are made and formed likewise as are the layers 20, 21 and 22 of the superficial circuit laminate 6a employed in the modification of the foregoing embodiment.

Figure 8:
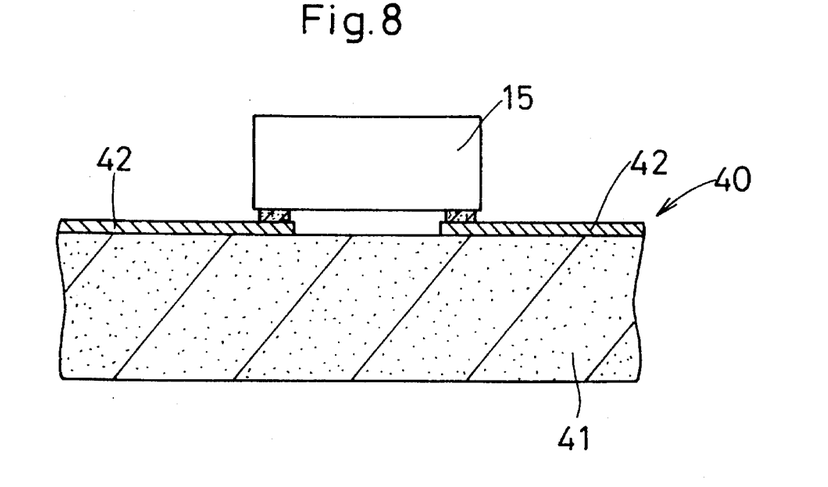
FIG. 8 is a schematic cross-sectional view of a third embodiment.

(b) FIG. 8 illustrates a circuit sub-assembly 40 in accordance with still another embodiment of the present invention. Referring to FIG. 8, the circuit sub-assembly 40 mainly comprises an Insulating substrate 41, and a circuit laminate 42 formed on the insulating substrate 41 and designed to have a desired circuit pattern. The insulating substrate 41 is a board formed of an electrically insulating composition containing 5.0 weight % or less oxygen. Examples of the material include a sintered product of either aluminum nitride or silicon carbide.

Figure 9:
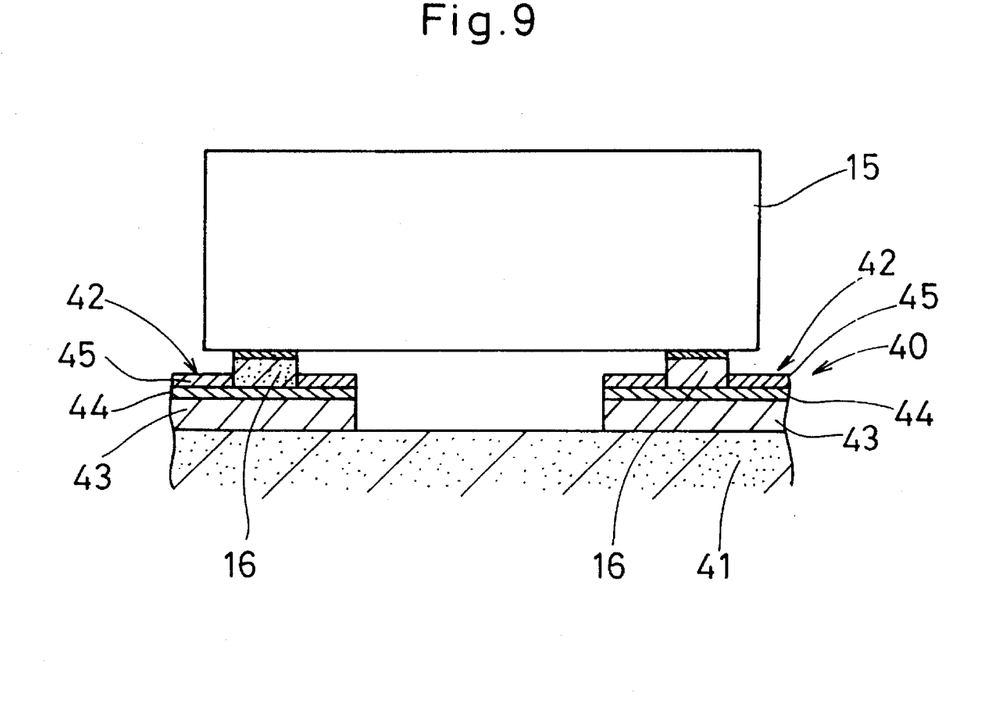
FIG. 9 is a partially enlarged view of FIG. 8.

As shown FIG. 9, the circuit laminate 42 is a triple-layer structure having a base film 43, an intermediate film 44 and a covering film 45, formed likewise as are those of corresponding circuit laminate 6 of FIG. 2.

Figure 10:
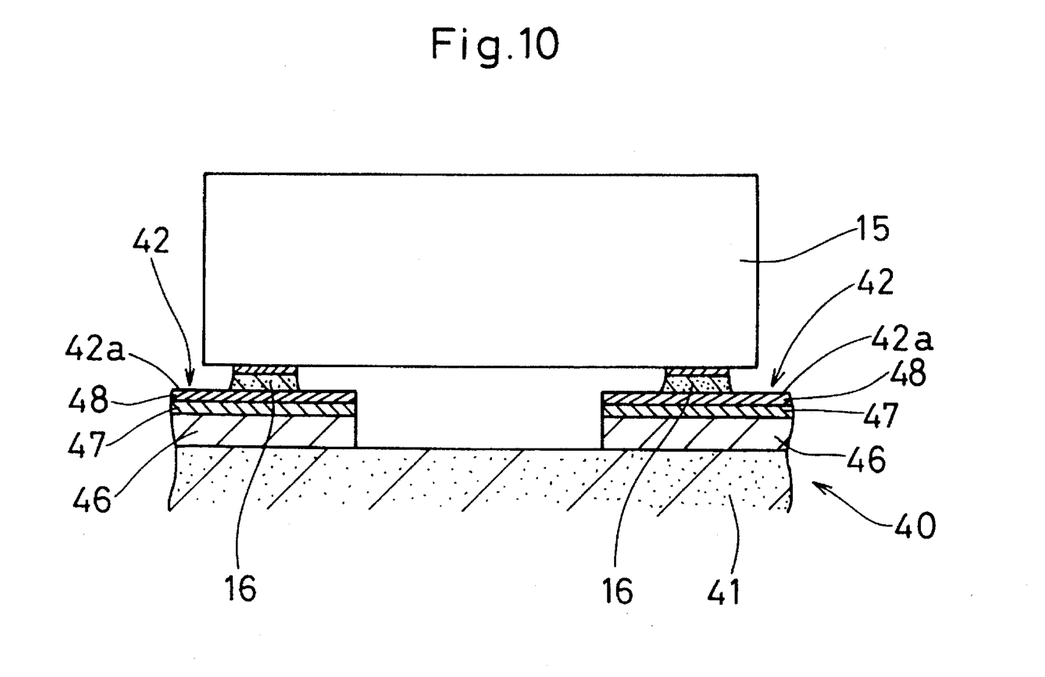
FIG. 10 is a view corresponding to FIG. 9 of a modification of the third embodiment.

Further, the circuit laminate 42 can be alternatively be formed likewise corresponding to the circuit laminate 6a of FIG. 3. Specifically, as shown in FIG. 10, the circuit laminate 42 can be formed as a triple-layer structure 42a having base, intermediate and covering films 46, 47, and 48, which are respectively formed corresponding to the base, intermediate and covering films 20, 21 and 22 composing circuit laminate 6a.

Since the amount of oxygen present in the insulating substrate 41 is restricted to 5.0 percent or less by weight, the circuit laminate 42a of the circuit sub-assembly 40 of this modified embodiment is scarcely subject to oxidation. Accordingly the superconductivity of the circuit laminate 42a is scarcely impaired, such that it is capable of effecting high-speed conduction of electronic signals.

If the insulating substrate 41 is composed of a sintered product of aluminum nitride, the substrate 41 can be produced according to a procedure comprising the steps of: preparing a slurry mixture of aluminum nitride (AlN) powder, yttria ($Y_2O_3$) as a sintering assistant, organic binder and solvent; forming the slurry into a desirable form using a doctor blade or a calender roll; and baking the formed slurry.

Various details of the invention may be changed without departing from its spirit nor its scope. Furthermore, the foregoing description of the embodiment according to the present invention is provided for the purpose of illustration only, and not for the purpose of limiting the invention as defined by the appended claims and their equivalents.

What is claimed is:

1. A circuit sub-assembly as a mounting for a superconducting electronic component, comprising:

an insulating substrate composed of ceramic material and comprising a sintered body selected from the group consisting of aluminum oxide and mullite, an oxygen-shielding barrier layer formed on the insulating substrate, and a superconducting circuit film of niobium formed on the barrier layer, wherein said barrier layer is formed of at least one element selected from the group consisting of titanium, molybdenum, wolfram, aluminum, tantalum, titanium-wolfram, tantalum nitride and an electrically insulating resin.

2. A circuit sub-assembly according to claim 1, further comprising:

a bonding film of at least one metallic element selected from the group consisting of copper, gold, silver, platinum, lead and tin, formed on said circuit layer; and a covering film of at least one metallic element selected from the group consisting of niobium, molybdenum, titanium, tantalum, wolfram, aluminum and rhenium, formed on said bonding film exclusive of a position to which said electronic component is correspondingly mounted.

3. A circuit sub-assembly according to claim 2, wherein said bonding film and said covering film are within the respective ranges of 1.0 to 10.0 μm, and 0.05 to 2.0 μm in thickness.

4. A circuit sub-assembly according to claim 1, further comprising:

a first metallic film, to which said electronic component is fixed, said first metallic film being formed of a metal on said circuit film, said metal having a degree of magnetic susceptibility that is sufficiently low such that electronic signals passing through the circuit film generate substantially no magnetic fields in the circuit film; and a second metallic-film, formed on said first film and composed of a metal selected from the group consisting of tin and tin-lead alloy.

5. A circuit sub-assembly according to claim 4, wherein said metal used to form said first metallic film is copper.

6. A circuit sub-assembly according to claim 5, wherein said first film and said second film are within the respective ranges of 1.0 to 10.0 μm, and 0.1 to 3.0 μm in thickness.

7. A circuit sub-assembly according to claim 6, further comprising:

a covering film of at least one metal selected from the group consisting of niobium, molybdenum, titanium, tantalum, wolfram, rhenium and aluminum, and formed on said second metallic layer; wherein said covering film is within the range of 0.05 to 2.0 μm in thickness.

8. A circuit sub-assembly according to claim 1, further comprising:

an insulator incorporating an internal circuit of niobium, formed on said circuit film, wherein said internal circuit is in connection with said circuit film; and a superficial circuit film in connection with said internal circuit, composed of niobium and formed on said insulator.

9. A circuit sub-assembly according to claim 8, further comprising:

a bonding film of at least one metallic element selected from the group consisting of copper, gold, silver, platinum, lead and tin, formed on said superficial circuit layer.

a covering film of at least one metallic element selected from the group consisting of niobium, molybdenum, titanium, tantalum, wolfram, aluminum and rhenium, formed on said bonding film exclusive of a position to which said electronic component is correspondingly mounted.

10. A circuit sub-assembly according to claim 9, wherein said bonding film and said covering film are within the respective ranges of 1.0 to 10.0 μm, and 0.05 to 2.0 μm in thickness.

11. A circuit sub-assembly according to claim 8, further comprising:

a first metallic film to which said electronic component is fixed, said first metallic film being formed of a metal on said superficial circuit film, said metal having a degree of magnetic susceptibility that is sufficiently low such that electronic signals passing through the circuit film generate substantially no magnetic fields in the circuit film; and a second metallic film, formed on said first film and composed of a metal selected from the group consisting of tin and tin-lead alloy.

12. A circuit sub-assembly according to claim 11, wherein said metal used to form said first metallic film is copper.

13. A circuit sub-assembly according to claim 12, wherein said first film and said second film are within the respective ranges of 1.0 to 10.0 μm, and 0.1 to 3.0 μm in thickness.

14. A circuit sub-assembly according to claim 13, further comprising:

a covering film of at least one metallic element selected from the group consisting of niobium, molybdenum, titanium, tantalum, wolfram, rhenium and aluminum, formed on said second metallic film; wherein said covering film is within the range of 0.05 to 2.0 μm in thickness.

* * * * *